US009023741B2

(12) United States Patent
Wang et al.

(10) Patent No.: US 9,023,741 B2
(45) Date of Patent: May 5, 2015

(54) METHOD FOR SURFACE TREATMENT (71) Applicant: BOE Technology Group Co., Ltd., Beijing (CN)

(72) Inventors: Xianghua Wang, Beijing (CN); Xianfeng Xiong, Beijing (CN); Longzhen Qiu, Beijing (CN); Ze Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/084,368

(22) Filed: Nov. 19, 2013

(65) Prior Publication Data

US 2014/0141564 A1    May 22, 2014

(30) Foreign Application Priority Data

Nov. 20, 2012   (CN) .......................... 2012 1 0472646

(51) Int. Cl.
H01L 21/00    (2006.01)
H01L 51/00    (2006.01)

(52) U.S. Cl.
CPC .......... *H01L 51/0005* (2013.01); *Y10S 438/906* (2013.01)

(58) Field of Classification Search
USPC ......... 438/795, 906, 796, 798, 378, 702, 689, 438/700, 699, 703, 308
See application file for complete search history.

(56) References Cited

U.S. PATENT DOCUMENTS

| 2003/0011304 A1* | 1/2003 | Duineveld et al. ............. 313/506 |
| 2005/0196969 A1* | 9/2005 | Gunner et al. ................ 438/725 |
| 2006/0213441 A1 | 9/2006 | Kobrin |
| 2007/0194386 A1 | 8/2007 | Hahn |
| 2008/0075885 A1* | 3/2008 | Nie et al. ....................... 427/553 |

FOREIGN PATENT DOCUMENTS

CN    101238556 A    6/2008

OTHER PUBLICATIONS

English translation of text portion of first Office Action in corresponding Chinese Application No. 2012104726460.

* cited by examiner

*Primary Examiner* — Thanh Y Tran
(74) *Attorney, Agent, or Firm* — Kinney & Lange, P.A.

(57)   ABSTRACT

A method for surface treatment is disclosed which relates to the technical field of producing thin-film devices by printing and solves the problem that the treatment of a substrate surface in the prior art can hardly meet the requirement for printing. The method for surface treatment includes a step of subjecting a surface of a base plate having at least two kinds of substrate patterns formed thereon to a surface treatment for forming a self-assembled monomolecular layer for at least once and a surface treatment by ultraviolet-ozone cleaning, so as to make the difference between the surface energies of the substrate patterns larger or smaller. The method for surface treatment of the invention is suitable for the surface treatment of the substrate surface during producing thin-film devices by printing.

17 Claims, 6 Drawing Sheets

METHOD FOR SURFACE TREATMENT

FIELD OF THE INVENTION

The invention relates to the technical field of producing a thin film device by printing, specifically, to a method for surface treatment.

BACKGROUND OF THE INVENTION

Ink jet printing technology is one of the main technologies used for printing in the modern office. In recent years, the researchers begin to attempt to use the ink jet printing technology in the production of plane functional materials, such as polymeric conductive films, color organic light emitting diode, thin film semiconductor devices, and the like.

Ink jet printing means that after spreading, drying and solidifying, an ink material printed on a substrate by spraying forms a film and eventually a thin film meeting special requirements for properties is obtained. The quality of the printed thin film includes the morphology of the thin film and the state of the thin film at the interface of the substrate, which are the critical factors determining the properties of the printed thin film device. On the one hand, the surface energy of the substrate affects the quality of the printed thin film, wherein the value of the surface energy is the sum of a dispersive component and a polar component. On the other hand, the quality of the printed thin film also depends on the printed ink. Due to the own characters of inks, different inks also have different requirements for the dispersive component and/or the polar component of the substrate.

In the prior ink-jet printing, the substrate patterns of different materials have been deposited on some regions on a base plate, and substrate patterns of different materials have different surface energies. Additionally, the different requirement for printing results in a different requirement for the surface energies of different substrate patterns. For example, in order to obtain a uniform morphology of a thin film, the difference between the surface energies of the various substrate patterns should be reduced to make the surface energies similar. However, in order to increase the precision of thin film printing, the difference between surface energies of the various substrate patterns is required to be increased. Thus, it is required to modify the surface energy of the substrate pattern according to the actual requirement, so as to make the difference between surface energies of the various substrate patterns larger or smaller.

SUMMARY OF THE INVENTION

The invention, in various embodiments, provides a method for surface treatment. By the method for surface treatment, the dispersive component and/or the polar component of a substrate pattern is modified, and furthermore, the surface energy of the substrate pattern is modified, so as to make the difference between the surface energies of different substrate patterns larger or smaller, in order to meet the requirement for printing.

In order to achieve the above-mentioned object, the examples of the invention make use of the following technical solutions.

The invention, in an exemplary embodiment, provides a method for surface treatment, comprising a step of subjecting a surface of a base plate having at least two kinds of substrate patterns formed thereon to a surface treatment for forming a self-assembled monomolecular layer for at least once and a surface treatment by ultraviolet-ozone cleaning, so as to make the difference between the surface energies of the different substrate patterns larger or smaller.

Optionally, the surface treatment for forming a self-assembled monomolecular layer specifically comprises:
  adding a material for forming a monomolecular layer or a solution containing a material for forming a monomolecular layer at a first position in a containment space, and placing the base plate having the at least two kinds of substrate patterns at a second position in the containment space, so as to make the material for forming a monomolecular layer form a monomolecular layer on the surfaces of the substrate patterns.

Optionally, the method further comprises: before adding the material for forming a monomolecular layer or the solution containing the material for forming a monomolecular layer at the first position in the containment space, keeping charging an inert gas into the containment space to discharge the air in the containment space;
  after placing the base plate having the at least two kinds of substrate patterns at the second position in the containment space, sealing the containment space and stopping charging the inert gas;
  carrying out air-exhausting for a time period so as to make the material for forming a monomolecular layer form a monomolecular layer on the surfaces of the substrate patterns;
  charging the inert gas slowly again to equilibrize the pressure in the containment space and the external pressure.

Optionally, the material for forming a monomolecular layer is a fluorine-containing hydrophobic silane, a fluorine-containing thiophenol, or a hydrophobic silane having an alkyl chain structure.

Optionally, the surface treatment for forming a self-assembled monomolecular layer specifically comprises:
  adding a solution at a concentration into a reaction vessel, wherein the solution comprises the material for forming a monomolecular layer and an organic solvent;
  placing the base plate having the at least two kinds of substrate patterns into the solution comprising the material for forming a monomolecular layer and the organic solvent, and soaking the base plate for a time period, so as to make the material for forming a monomolecular layer form a monomolecular layer on the surfaces of the substrate patterns.

Optionally, in an oxygen-free environment, at least the material for forming a monomolecular layer is mixed with the organic solvent to prepare a solution.

Optionally, the method further comprises:
  before adding the solution at a concentration into a reaction vessel, keeping charging an inert gas into the reaction vessel, so as to discharge the air in the reaction vessel;
  after placing the base plate having the at least two kinds of substrate patterns into the solution comprising the material for forming a monomolecular layer, sealing the reaction vessel.

Optionally, the material for forming a monomolecular layer is a fluorine-containing thiophenol, an alkyl thiol, or a hydrophobic silane having an alkyl chain structure.

Optionally, the surface treatment for forming a self-assembled monomolecular layer is conducted twice or more, wherein the materials for forming a monomolecular layer used in each time of the surface treatment for forming a self-assembled monomolecular layer conducted twice or more are different.

Optionally, in the surface treatment by ultraviolet-ozone cleaning, the time of the ultraviolet-ozone cleaning is adjusted correspondingly according to the requirement for the surface energies of the substrates.

The invention, in an exemplary embodiment, provides a method for surface treatment, wherein the dispersive component and/or the polar component of one substrate pattern is modified by conducting the surface treatment for forming a self-assembled monomolecular layer once, and furthermore, the surface energy of the substrate pattern is modified; by the surface treatment by ultraviolet-ozone cleaning, the dispersive component and/or the polar component of the same substrate patterns is modified, and furthermore, the surface energy of the substrate pattern is modified, or, the dispersive components and/or the polar components of different substrate patterns are modified, and furthermore, the surface energies of the substrate patterns are modified, so as to make the difference between the surface energies of the different substrate patterns larger or smaller, in order to meet various requirements for printing.

BRIEF DESCRIPTION OF THE DRAWINGS

In order to describe the technical solutions in the invention or in the prior art more clearly, the drawings used for describing the examples or the prior art are briefly described now. It is obvious that the drawings in the description below are only some examples of the invention. Those skilled in the art can, without inventive labor, further attain other drawings, according to these drawings.

Description of Reference Sign

1—a gold substrate pattern; 2—a silica substrate pattern.

DETAILED DESCRIPTION OF THE INVENTION

The technical solutions in the invention will be described clearly and completely in combination with the drawings in the invention. Obviously, the examples described are only a part of, but not all of the examples of the invention.

The invention is described in detail by using an ink-jet printed bottom-contact OTFT (organic thin film transistor) as an example. The printed bottom-contact organic thin film transistor indicates that in the organic thin film transistor, a metal electrode is located under the semiconductor.

An organic thin film transistor comprises a source electrode, a drain electrode, a gate electrode, and a semiconductor layer and an insulator layer. In the invention, a top-gate organic thin film transistor is used as an example. Exemplarily, during the production of an organic thin film transistor, on a silicon base sheet (i.e. the base plate), a silica layer is grown as a second substrate pattern (hereafter referred to as a silica substrate pattern), which generally covers the entire base plate; and then a source electrode and a drain electrode are produced as a first substrate pattern (hereafter referred to as a gold substrate pattern) on the silica by using gold (Au); and then a semiconductor layer is formed between the source electrode and the drain electrode by printing a poly(3-hexylthiophene) (P3HT, an organic polymer semiconductor) ink solution (concentration: 0.25-0.75 wt %), in which the solvent is o-dichlorobenzene; and at last a gate electrode is formed on the semiconductor layer, so as to produce an organic thin film transistor.

Generally, before the poly(3-hexylthiophene) ink solution is printed, it is necessary to treat the base plate having the silica substrate pattern and the gold substrate pattern formed thereon. The methods for surface treatment provided below in the invention can be used for this, and the effect of the methods provided in the invention on the surface energy of the substrate patterns will be analyzed in detail with regard to the materials of the two substrate patterns. Of course, a substrate pattern formed on the base plate is not limited to these two kinds of substrate pattern and can be a substrate formed of other materials. Furthermore, the number of substrate patterns is not limited to 2 and can be 3 or more, wherein the substrate patterns are formed of different materials. In the examples of the invention, the detailed explanation is made by using a base plate having a silica substrate pattern and a gold substrate pattern formed thereon as an example.

The invention, in an exemplary embodiment, provides a method for surface treatment, comprising a step of subjecting a surface of a base plate having at least two kinds of substrate patterns formed thereon to a surface treatment for forming a self-assembled monomolecular layer for at least once and a surface treatment by ultraviolet-ozone cleaning, so as to make the difference between the surface energies of the different substrate patterns larger or smaller.

Here, a substrate pattern generally indicates a pattern formed of one material and located in the same layer. The substrate pattern can be an entire connected pattern, e.g. the silica substrate pattern mentioned above, or can be several disconnected patterns, e.g. the gold substrate pattern mentioned above (including a source electrode and a drain electrode).

The principles for modifying the surface energy of substrate pattern in different surface treatments may be different, and the different surface treatments can affect each other, thus if the order of various treatments is different, the modification to the surface energy of the substrate pattern is also different. Specifically, in the surface treatment for forming a self-assembled monomolecular layer, the surface energy of the substrate pattern is modified because a chemical reaction occurs between the material for forming a monomolecular layer and the hydroxy groups located in the surface of the substrate pattern and thus a monomolecular layer is formed on the surface of the substrate pattern; in the surface treatment by ultraviolet-ozone cleaning, the essential principle is that eliminating the organic molecules on the surface of the substrate pattern will increase the amount of hydroxy groups on the substrate surface, and thus the polar component of the surface energy of the substrate pattern increases significantly, and at the same time, the uniformity of the surface of the substrate pattern is also improved, furthermore, in a certain range of the duration of the surface treatment, the surface energy of the substrate pattern can be controlled in a relatively wide range by controlling the duration of the ultraviolet-ozone cleaning.

If the surface treatment for forming a self-assembled monomolecular layer is conducted twice or more, it is preferred that different materials for forming a monomolecular layer, are respectively used in each time of the surface treatment for forming a self-assembled monomolecular layer conducted twice or more, so that monomolecular layers formed of different organic molecules are formed on the surfaces of the substrate patterns.

The surface treatment for forming a self-assembled monomolecular layer, which includes a wet liquid phase surface treatment for forming a self-assembled monomolecular layer and a dry gas phase surface treatment for forming a self-assembled monomolecular layer, is an efficient method to modify the surface energy of the substrate pattern. Here, the dry gas phase surface treatment for forming a self-assembled monomolecular layer includes that a material for forming a monomolecular layer or a solution containing the material for forming a monomolecular layer and a base plate having at least two substrate patterns formed thereon are placed in the same containment space, and the material for forming a monomolecular layer or the solution containing the material for forming a monomolecular layer undergoes a surface chemical reaction with the substrate pattern via diffusion, so as to form a monomolecular layer on the surface of the substrate pattern. The wet liquid phase surface treatment for forming a self-assembled monomolecular layer includes that the base plate having at least two substrate patterns formed thereon is soaked into a solution containing the material for forming a monomolecular layer, and the material for forming a monomolecular layer undergoes a surface chemical reaction with the substrate pattern, so as to form a monomolecular layer on the surface of the substrate pattern. The materials generally used for the dry gas phase surface treatment for forming a self-assembled monomolecular layer are fluorine-containing hydrophobic silanes, fluorine-containing thiophenols, or hydrophobic silanes having an alkyl chain structure; and the materials generally used for the wet liquid phase surface treatment for forming a self-assembled monomolecular layer are fluorine-containing thiophenols, alkyl thiols, or hydrophobic silanes having an alkyl chain structure. In the invention, the hydrophobic silanes having an alkyl chain structure are silanes having better hydrophobic properties and longer alkyl chain structure, e.g. octadecyltrichlorosilane (OTS).

Here, the fluorine-containing hydrophobic silanes include perfluorododecyltrichlorosilane (FDTS) or the like; the fluorine-containing thiophenols include pentafluorothiophenol (PFTP) or the like; and the hydrophobic silanes having an alkyl chain structure include octadecyltrichlorosilane or the like. The material for forming a monomolecular layer can be in solid state or in liquid state, and the solution containing the material for forming a monomolecular layer can be a mixed solution of the material for forming a monomolecular layer and an organic solvent or the like. The invention is described in detail by using a liquid material for forming a monomolecular layer as an example.

A material for forming a monomolecular layer generally has a remarkable selectivity for different substrate patterns, and thus also differently modifies the surface energies of different substrate patterns. For example, perfluorododecyltrichlorosilane can selectively form a monomolecular layer by self-assembling on the surface of the silica substrate pattern, so that the dispersive component and the polar component of the silica substrate pattern are can be remarkably reduced and ink droplets are not enable to spread or they trend to roll on the surface; pentafluorothiophenol can selectively form a monomolecular layer by self-assembling on the surface of the gold substrate pattern, so that the dispersive component of the gold substrate pattern can be efficiently reduced; octadecyltrichlorosilane can selectively form a monomolecular layer by self-assembling on the surface of the silica substrate pattern, so that the polar component of the silica substrate pattern can be efficiently reduced while the dispersive component of the silica substrate pattern is still relatively large. Therefore, it is possible to select different materials, which will form monomolecular layer, to treat the base plate having at least two substrate patterns formed thereon, according to the different requirements for printing.

The ultraviolet-ozone cleaning can modify the dispersive component and/or the polar component of a substrate pattern and further modify the surface energy of the substrate pattern. Here, the adjusting effects of the ultraviolet-ozone cleaning on the surface energies of different substrate patterns also have remarkable selectivity. For example, compared with the case of a gold substrate pattern, the ultraviolet-ozone cleaning improves the polar component of a silica substrate pattern more easily, and thus improves the surface energy of the silica substrate pattern. Additionally, in a certain range of the duration of the surface treatment, the longer the duration of the ultraviolet-ozone cleaning is, the larger is the surface energy of the silica substrate pattern. Therefore, it is possible to adjust the duration of the ultraviolet-ozone cleaning correspondingly, according to the requirement for printing, in order to meet different requirements for printing.

In the method for surface treatment provided in an exemplary embodiment of the invention, if the surface of the base plate having at least two substrate patterns formed thereon is subjected to the surface treatment for forming a self-assembled monomolecular layer once, it is possible to modify the dispersive component and/or the polar component of one substrate pattern, and furthermore, the surface energy of the substrate pattern; if the surface of base plate is subjected to the surface treatment for forming a self-assembled monomolecular layer twice or more and in each time a different material for forming a monomolecular layer is used, then in each time of the surface treatment for forming a self-assembled monomolecular layer, it is possible to modify the dispersive component and/or the polar component of the same substrate pattern, and furthermore, the surface energy of the substrate pattern, or, to modify the dispersive components and/or the polar components of the different substrate patterns, and furthermore, the surface energies of the different substrate patterns; if the surface of the base plate is subjected to the ultraviolet-ozone cleaning surface treatment, it is possible to modify the dispersive component and/or the polar component of the same substrate pattern, and furthermore, the surface energy of the substrate pattern, or, to modify the dispersive components and/or the polar components of the different substrate patterns, and furthermore, the surface energies of the substrate patterns. Thus, the difference between the surface energies of the substrate patterns becomes larger or smaller to meet the different requirements for printing.

The invention, in an exemplary embodiment, provides a method for surface treatment, comprising a step of subjecting a surface of a base plate having at least two kinds of substrate patterns formed thereon to a surface treatment for forming a self-assembled monomolecular layer for once and a surface treatment by ultraviolet-ozone cleaning, so as to make the difference between the surface energies of the different substrate patterns larger or smaller. Here, in the exemplary embodiment of the invention, the detailed explanation is made by using the base plate having two substrate patterns, i.e. the silica substrate pattern and the gold substrate pattern, as an example.

Here, the surface treatment for forming a self-assembled monomolecular layer for the base plate having at least two substrate patterns formed thereon can be: subjecting the surface of the base plate having at least two substrate patterns formed thereon to a dry gas phase surface treatment for forming a self-assembled monomolecular layer by using perfluorododecyltrichlorosilane; or subjecting the surface of the base plate having at least two substrate patterns formed thereon to a wet liquid phase surface treatment for forming a self-assembled monomolecular layer by using pentafluorothiophenol; or subjecting the surface of the base plate having at least two substrate patterns formed thereon to a wet liquid phase surface treatment for forming a self-assembled monomolecular layer by using octadecyltrichlorosilane. All of the above are subjecting the surface of the base plate having at least two substrate patterns formed thereon to a surface treatment for forming a self-assembled monomolecular layer, however, the materials for forming a monomolecular layer are different and the monomolecular layers formed on the surfaces of the substrate patterns are different, so that the surface energies of the substrate patterns are also different.

Specifically, subjecting the surface of the base plate having at least two substrate patterns formed thereon to a wet liquid phase surface treatment for forming a self-assembled monomolecular layer using pentafluorothiophenol specifically comprises: adding a solution at a concentration into a reaction vessel, wherein the solution contains a material for forming a monomolecular layer and an organic solvent; placing the base plate having at least two substrate patterns formed thereon into the above-mentioned solution containing the material for forming a monomolecular layer and soaking the base plate for some time, so as to make the material form a monomolecular layer on the surfaces of the substrate patterns.

Since an oxidation reaction may occur while octadecyltrichlorosilane being in contact with air, the solution may optionally be prepared from the material for forming a monomolecular layer and the organic solvent in an oxygen-free environment.

Specifically, before the above steps are carried out, subjecting the base plate having at least two substrate patterns formed thereon to a wet liquid phase surface treatment for forming a self-assembled monomolecular layer by using octadecyltrichlorosilane further comprises: before adding the solution at a concentration into a reaction vessel, keeping charging an inert gas into the reaction vessel, so as to discharge the air in the reaction vessel; and after placing the base plate having the at least two kinds of substrate patterns into the above solution comprising the material for forming a monomolecular layer, sealing the reaction vessel.

The air in the reaction vessel has been discharged with the inert gas. If the reaction space is sealed at this time, there is no air in the reaction vessel. Therefore after the reaction vessel is sealed, the charging of the inert gas can go on or stop, so far as that there is no air in the reaction space. In the invention, the explanation is made by using a method including sealing the reaction space as an example.

Figure 1:
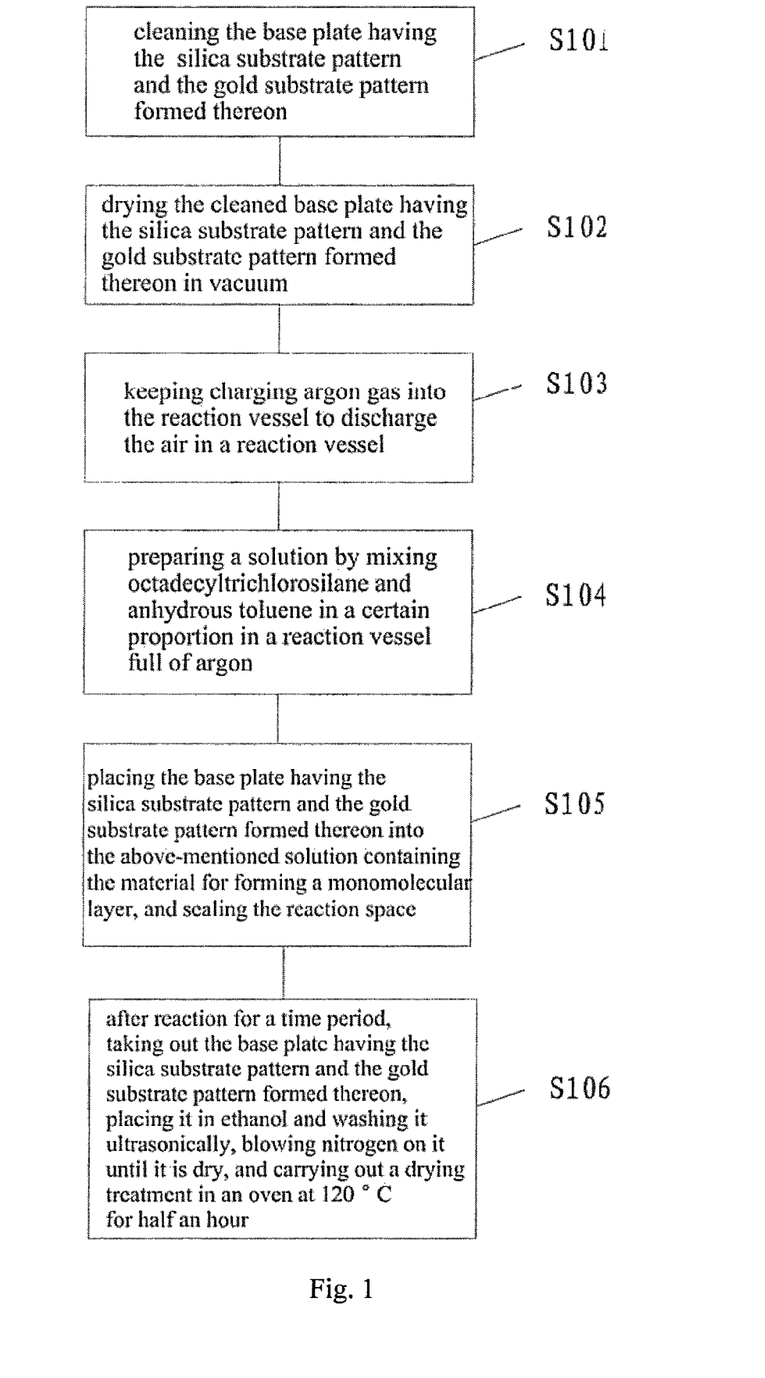
FIG. 1 is a schematic diagram of subjecting the surface of a base plate having a silica substrate pattern and a gold substrate pattern formed thereon to a wet liquid phase surface treatment for forming a self-assembled monomolecular layer by using octadecyltrichlorosilane.

Specifically, referring to FIG. 1, subjecting a base plate having a silica substrate pattern and a gold substrate pattern formed thereon to a wet liquid phase surface treatment for forming a self-assembled monomolecular layer by using octadecyltrichlorosilane can comprise the following steps of:

S101. cleaning the base plate having the silica substrate pattern and the gold substrate pattern formed thereon;

S102. drying the cleaned base plate having the silica substrate pattern and the gold substrate pattern formed thereon in vacuum;

S103. keeping charging argon gas into the reaction vessel to discharge the air in a reaction vessel;

S104. preparing a solution by mixing octadecyltrichlorosilane and anhydrous toluene in a certain proportion in a reaction vessel full of argon;

S105. placing the base plate having the silica substrate pattern and the gold substrate pattern formed thereon into the above-mentioned solution containing the material for forming a monomolecular layer, and sealing the reaction space;

S106. after reaction for a time period, taking out the base plate having the silica substrate pattern and the gold substrate pattern formed thereon, placing it in ethanol and washing it ultrasonically, blowing nitrogen on it until it is dry, and carrying out a drying treatment in an oven at 120° C. for half an hour.

Figure 2:
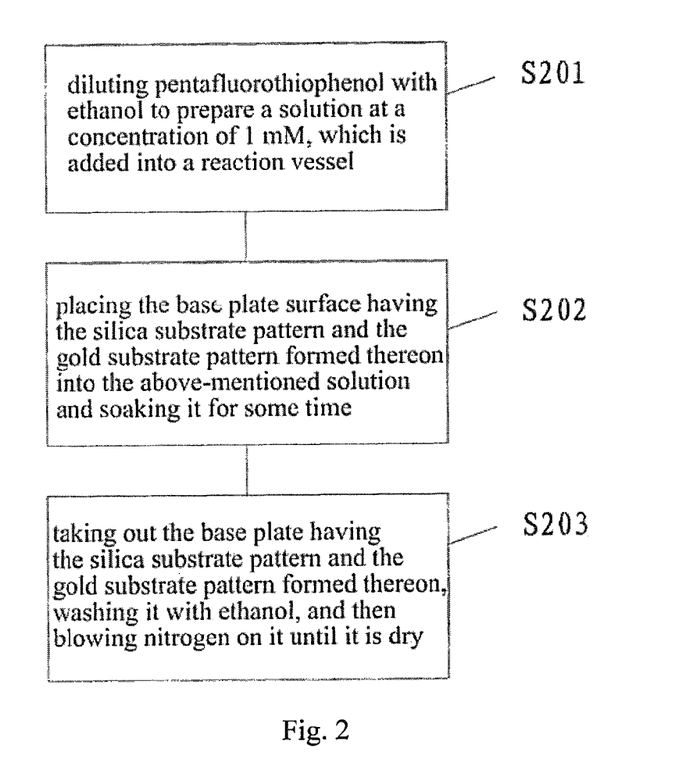
FIG. 2 is a schematic diagram of subjecting the surface of a base plate having a silica substrate pattern and a gold substrate pattern formed thereon to a wet liquid phase surface treatment for forming a self-assembled monomolecular layer by using pentafluorothiophenol.

Of course, the specific steps of the surface treatment mentioned above are not limited to the steps mentioned above. For example, step S104 can also be: preparing a solution at a concentration by mixing octadecyltrichlorosilane and anhydrous toluene in a certain proportion in an oxygen-free environment, and then adding it to a reaction vessel full of argon;

Specifically, referring to FIG. 2, subjecting a base plate having a silica substrate pattern and a gold substrate pattern formed thereon to a wet liquid phase surface treatment for forming a self-assembled monomolecular layer by using pentafluorothiophenol can comprise the following steps of:

S201. diluting pentafluorothiophenol with ethanol to prepare a solution at a concentration of 1 mM, which is added into a reaction vessel;

S202. placing the base plate surface having the silica substrate pattern and the gold substrate pattern formed thereon into the above-mentioned solution and soaking it for some time;

S203. taking out the base plate having the silica substrate pattern and the gold substrate pattern fowled thereon, washing it with ethanol, and then blowing nitrogen on it until it is dry.

In the exemplary embodiment of the invention, the detailed explanation is made by using the following as an example: subjecting the base plate having the silica substrate pattern and the gold substrate pattern formed thereon to a dry gas phase surface treatment for forming a self-assembled monomolecular layer by using perfluorododecyltrichlorosilane and to a ultraviolet-ozone cleaning surface treatment.

Figure 3:
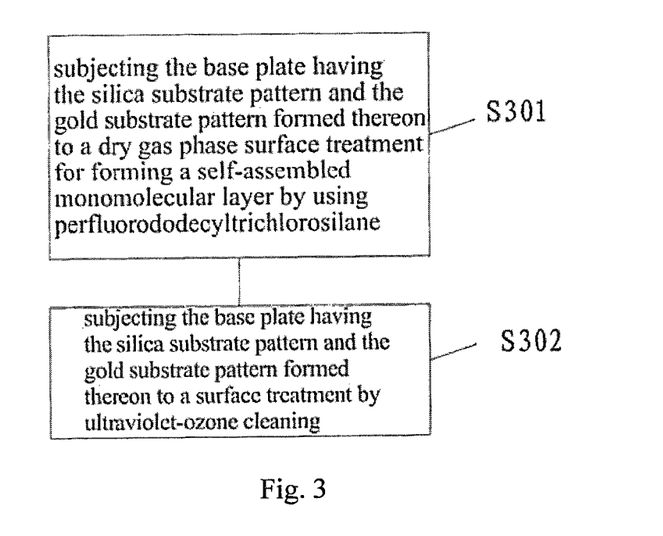
FIG. 3 is a schematic diagram of a method for surface treatment provided in the invention.

Specifically, referring to FIG. 3, the above-mentioned method for surface treatment comprises:

S301. subjecting the base plate having the silica substrate pattern and the gold substrate pattern formed thereon to a dry gas phase surface treatment for forming a self-assembled monomolecular layer by using perfluorododecyltrichlorosilane;

S302. subjecting the base plate having the silica substrate pattern and the gold substrate pattern formed thereon to a surface treatment by ultraviolet-ozone cleaning.

Of course, it is possible to carry out the step S302 firstly and then carry out the step S301. However, the value of the surface energy of the substrate pattern treated like this is not the same as that of the substrate pattern undergoing firstly the step S301 and then the step S302. Specifically, the step S301 is essentially a surface chemical reaction, which happens between perfluorododecyltrichlorosilane and the hydroxy groups located in the surface of the substrate pattern and forms a monomolecular layer, which can reduce the surface energy of the substrate pattern; the step S302 increases the polar component of the surface energy of the substrate pattern, increases the surface energy of the substrate pattern, and improves the uniformity of the surface of the substrate pattern. Accordingly, the surface energy of the substrate pattern treated by the step S301 and the step S302 in turn can be controlled in a relatively large range and the surface of the substrate pattern is more uniform; whereas the surface of the substrate pattern treated by the step S302 and the step S301 in turn is more uniform, but the surface energy of the substrate pattern is smaller.

In the exemplary embodiment of the invention, the detailed explanation is made by using the following case as an example: carrying out the step S301 firstly and then carrying out the step S302.

Optionally, the step S301 specifically comprises: adding a material for forming a monomolecular layer or a solution containing a material for forming a monomolecular layer at a first position in a containment space, and placing the base plate having the at least two kinds of substrate patterns at a second position in the containment space, so that under the effect of molecular diffusion, the material for forming a monomolecular layer undergoes a surface chemical reaction with the substrate surface so as to form a monomolecular layer on the surface of the substrate pattern.

The material for forming a monomolecular layer can be in solid state or in liquid state, and the solution containing the material for forming a monomolecular layer can be a mixed solution of the material for forming a monomolecular layer and an organic solvent or the like. In the invention, the detailed explanation is made by using a liquid material for forming a monomolecular layer as an example.

Here, the containment space is enclosed by the device carrying out the above-mentioned dry gas phase surface treatment for forming a self-assembled monomolecular layer. The first position is the position at which the material for faulting a monomolecular layer is placed. The second position is the position at which the base plate having at least two substrate patterns formed thereon is placed. The specific positions of the first position and the second position are determined by the specific device.

With regard to some materials for forming a monomolecular layer, reactions occur while the materials are in contact with air. In this case, an oxygen-free environment is needed for carrying out the above-mentioned method for surface treatment. The oxygen-free environment may be either a vacuum environment or an environment full of an inert gas. In the invention, the detailed explanation is made by using following case as an example: placing the material for forming a monomolecular layer and the substrate in an environment full of an inert gas, and then performing the method while keeping vacuumizing.

Optionally, the method comprises: before adding the material for forming a monomolecular layer or the solution containing the material for forming a monomolecular layer at the first position in the containment space, keeping charging an inert gas into the containment space to discharge the air in the containment space; after placing the base plate having the at least two kinds of substrate patterns at the second position in the containment space, sealing the containment space and stopping charging the inert gas; carrying out air-exhausting for a time period so as to make the material undergo a surface chemical reaction with the substrate pattern and form a monomolecular layer on the surfaces of the substrate patterns; charging the inert gas slowly again to equilibrize the pressure in the containment space and the external pressure.

Figure 4:
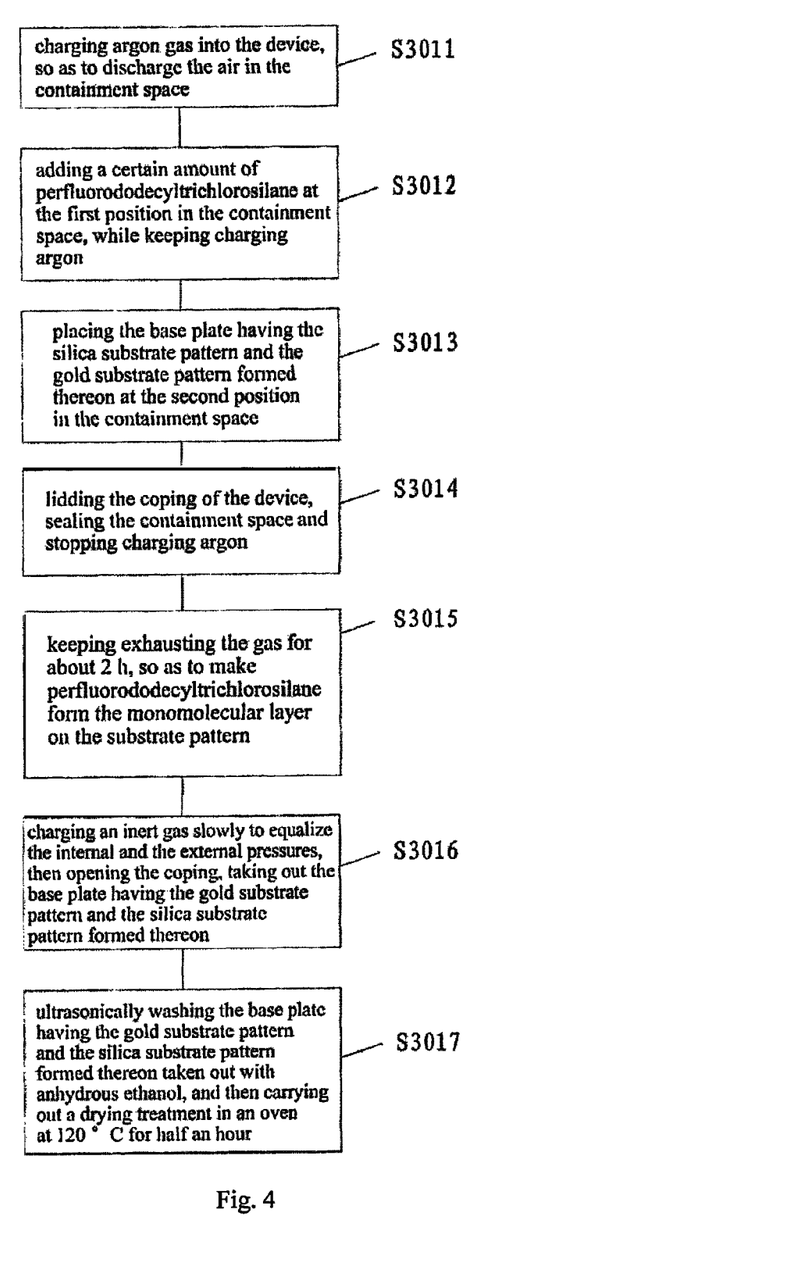
FIG. 4 is a schematic diagram of subjecting the surface of a base plate having a silica substrate pattern and a gold substrate pattern formed thereon to a dry gas phase surface treatment for forming a self-assembled monomolecular layer by using perfluorododecyltrichlorosilane provided in the invention.

Specifically, referring to FIG. 4, the above-mentioned step S301 can comprise the following steps of:

S3011. charging argon gas into the device (flow rate 40-50 sccm, 30 min), so as to discharge the air in the containment space;

S3012. adding a certain amount of perfluorododecyltrichlorosilane at the first position in the containment space, while keeping charging argon;

S3013. placing the base plate having the silica substrate pattern and the gold substrate pattern formed thereon at the second position in the containment space, so as to make perfluorododecyltrichlorosilane form a monomolecular layer on the surfaces of the substrate patterns.

Preferably, it is possible to allow the surface having the silica substrate pattern and the gold substrate pattern formed thereon of the base plate having the silica substrate pattern and the gold substrate pattern formed thereon upwards, in order to completely expose the gold substrate pattern and the silica substrate pattern in the containment space. It is advantageous for the generation of the monomolecular layer on the surface having the gold substrate pattern and the silica substrate pattern formed thereon by contacting perfluorododecyltrichlorosilane with the gold substrate pattern and with the silica substrate pattern.

S3014. lidding the coping of the device, sealing the containment space and stopping charging argon;

S3015. keeping exhausting the gas for about 2 h, so as to make perfluorododecyltrichlorosilane form the monomolecular layer on the substrate pattern;

S3016. charging an inert gas slowly to equalize the internal and the external pressures, then opening the coping, taking out the base plate having the gold substrate pattern and the silica substrate pattern formed thereon;

S3017. ultrasonically washing the base plate having the gold substrate pattern and the silica substrate pattern formed thereon taken out with anhydrous ethanol, and then carrying out a drying treatment in an oven at 120° C. for half an hour.

Here, the above-mentioned subjecting the base plate having the gold substrate pattern and the silica substrate pattern formed thereon to the dry gas phase surface treatment for forming a self-assembled monomolecular layer by using perfluorododecyltrichlorosilane is not limited to the steps mentioned above. For example, the step S3012 can also be: placing the base plate having the gold substrate pattern and the silica substrate pattern formed thereon at the second position in the containment space and allowing the surface having the silica substrate pattern and the gold substrate pattern formed thereon of the base plate having the silica substrate pattern and the gold substrate pattern formed thereon upwards, so as to make perfluorododecyltrichlorosilane form the monomolecular layer on the surface having the silica substrate pattern and the gold substrate pattern formed thereon, and keeping charging argon; and accordingly, step S3013 is adding a certain amount of perfluorododecyltrichlorosilane at the first position in the containment space.

The above-mentioned step S302, that is, subjecting the base plate surface having the silica substrate pattern and the gold substrate pattern formed thereon to a surface treatment by ultraviolet-ozone cleaning specifically comprises the following step of:

placing the base plate surface having the silica substrate pattern and the gold substrate pattern formed thereon into a ultraviolet-ozone cleaner, setting the temperature and the time, and pressing the start button to perform the ultraviolet-ozone cleaning. Here, before the base plate having the silica substrate pattern and the gold substrate pattern formed thereon is placed into the ultraviolet-ozone, it is also possible to subject the base plate having the silica substrate pattern and the gold substrate pattern formed thereon to other treatments.

Exemplarily, after the base plate having the silica substrate pattern and the gold substrate pattern formed thereon has been subjected to the dry gas phase surface treatment for forming a self-assembled monomolecular layer by using perfluorododecyltrichlorosilane, the base plate having the silica substrate pattern and the gold substrate pattern formed thereon is placed into the ultraviolet-ozone cleaner, the temperature is set to 35° C., the time is set to 8 min, and the start button is pressed to perform the ultraviolet-ozone cleaning.

Figure 5:
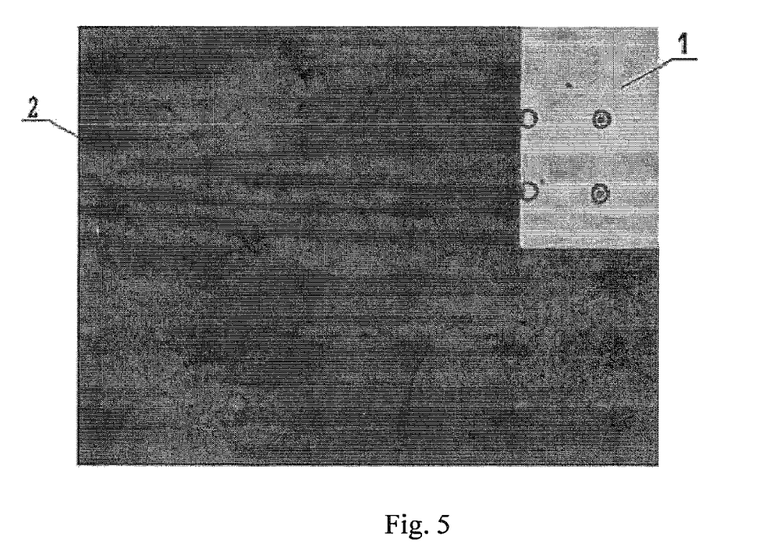
FIG. 5 is an optical photograph of the printed lattice obtained after the surface of the base plate having a silica substrate pattern and a gold substrate pattern formed thereon is treated according to the method shown in FIG. 3.

In order to show the effects of the above-mentioned method, explanation is made referring to FIG. 5. The surface energy of the substrate pattern can be characterized by the size of the ink dot, which is formed of the ink droplet on the substrate pattern, since on a substrate having a larger surface energy, the ink dot formed by the spreading of the ink droplet is larger, whereas on a substrate having a smaller surface energy, the ink dot formed by the spreading of the ink droplet is smaller. After the base plate having the gold substrate pattern 1 and the silica substrate pattern 2 formed thereon is subjected to the method for surface treatment mentioned above, the optical photograph of the printed lattice is as that shown in FIG. 5, wherein on the surface of the silica substrate pattern 2 and on the surface of the gold substrate pattern 1, the sizes of the ink dots formed by the spreading of the ink droplets (concentration of the ink: 0.3 wt %) are similar. It shows that after the treatment, the surface energies of the two substrate patterns are close to each other, and the ink-jet printed thin film pattern has a good continuity in the boundary zone between the two substrate patterns, which is advantageous for printing a thin film pattern having uniformity.

The invention, in an exemplary embodiment, provides a method for surface treatment, comprising a step of subjecting a surface of a base plate having at least two kinds of substrate patterns formed thereon to a surface treatment for forming a self-assembled monomolecular layer for twice and a surface treatment by ultraviolet-ozone cleaning, so as to make the difference between the surface energies of the different substrate patterns larger or smaller. Here, different materials for forming a monomolecular layer are used in each of the two times.

Figure 6:
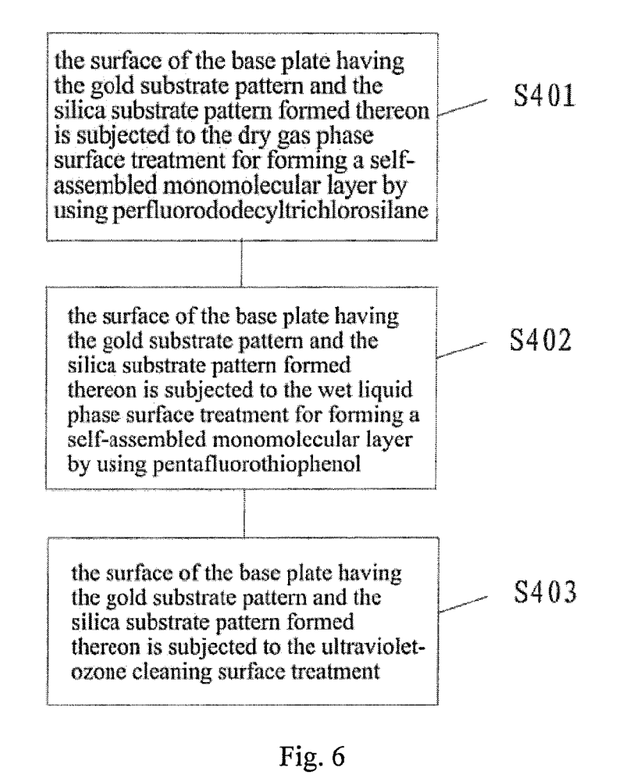
FIG. 6 is a schematic diagram of another method for surface treatment provided in the invention.

Specifically, referring to FIG. 6, the above-mentioned method for surface treatment comprises the following steps of:

S401. the surface of the base plate having the gold substrate pattern and the silica substrate pattern formed thereon is subjected to the dry gas phase surface treatment for forming a self-assembled monomolecular layer by using perfluorododecyltrichlorosilane;

specifically, it is possible to subject the surface of the base plate having the gold substrate pattern and the silica substrate pattern formed thereon to the dry gas phase surface treatment for forming a self-assembled monomolecular layer by using perfluorododecyltrichlorosilane, referring to the step S301;

S402. the surface of the base plate having the gold substrate pattern and the silica substrate pattern formed thereon is subjected to the wet liquid phase surface treatment for forming a self-assembled monomolecular layer by using pentafluorothiophenol;

specifically, the step S402 can refer to the above-mentioned step S201-step S203;

S403. the surface of the base plate having the gold substrate pattern and the silica substrate pattern formed thereon is subjected to the ultraviolet-ozone cleaning surface treatment;

specifically, it is possible to subject the surface of the base plate having the gold substrate pattern and the silica substrate pattern formed thereon to the ultraviolet-ozone cleaning surface treatment, referring to the step S302.

Figure 7:
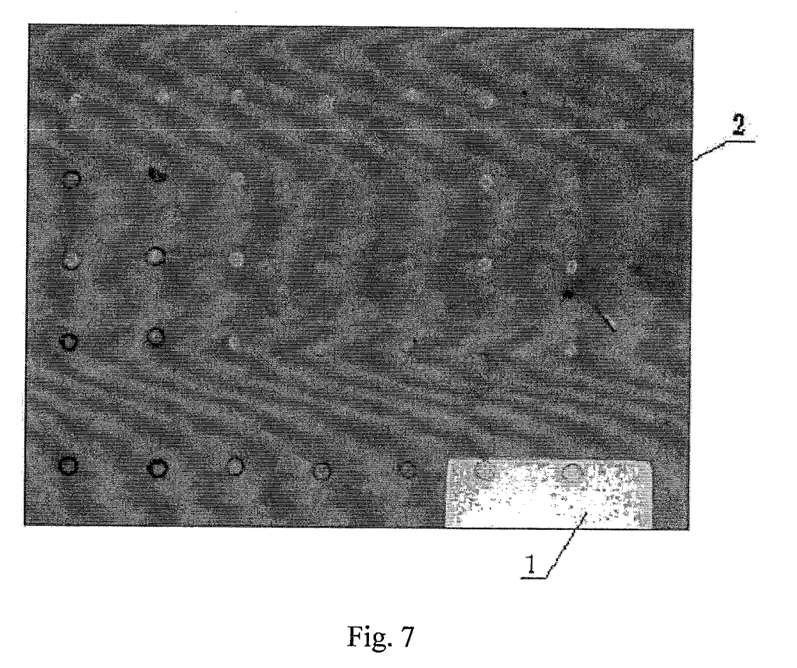
FIG. 7 is an optical photograph of the printed lattice obtained after the surface of a base plate having a silica substrate pattern and a gold substrate pattern formed thereon is subjected to a surface treatment by ultraviolet-ozone cleaning for 8 min by the method shown in FIG. 6.

In order to show the effects of the above-mentioned method, explanation is made referring to FIG. 7. After the base plate having the gold substrate pattern 1 and the silica substrate pattern 2 formed thereon is subjected to the treatment method mentioned above, the optical photograph of the printed lattice is as that shown in FIG. 7, wherein compared with that on the gold substrate pattern 1, the sizes of the ink dots formed by the spreading of the ink droplets (concentration of the ink: 0.3 wt %) on the silica substrate pattern 2 is smaller, which means that the corresponding thickness of the thin film is larger. It shows that after the treatment, the difference between the surface energies of the two substrate patterns is large, which is advantageous for printing a thin film pattern having a higher precision.

Figure 8:
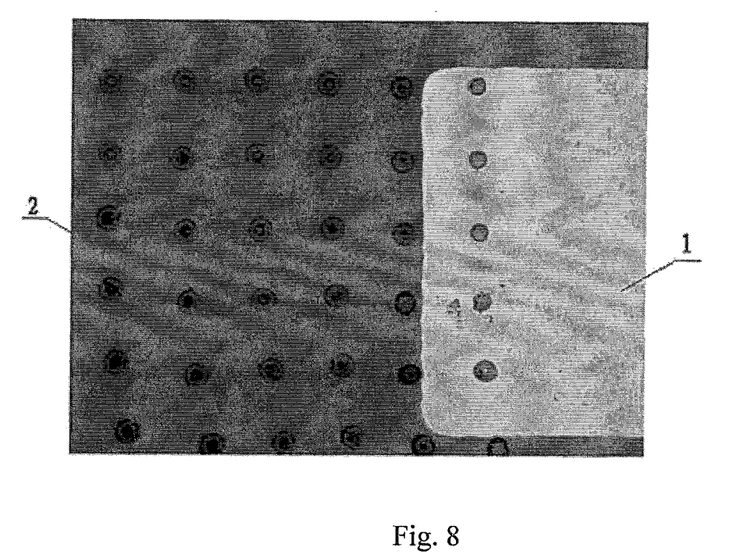
FIG. 8 is an optical photograph of the printed lattice obtained after the surface of a base plate having a silica substrate pattern and a gold substrate pattern formed thereon is subjected to a surface treatment by ultraviolet-ozone cleaning for 10 min by the method shown in FIG. 6.

Additionally, if the duration of the ultraviolet-ozone cleaning in the above-mentioned step S403 is different, the modification of the surface energy of the substrate pattern is also different. For example, the duration of the ultraviolet-ozone cleaning was changed to 10 min, then after the base plate having the gold substrate pattern 1 and the silica substrate pattern 2 formed thereon was subjected to the treatment mentioned above, the optical photograph of the printed lattice on the gold substrate pattern and the silica substrate pattern is as that shown in FIG. 8, wherein compared with that on the gold substrate pattern 1, the sizes of the ink dots formed by the spreading of the ink droplets on the silica substrate pattern 2 is larger. And compared with in the surface treatment of FIG. 7, the only difference is that the duration of the ultraviolet-ozone cleaning is extended in the surface treatment FIG. 8. It can be concluded therefrom, that in a certain range of the duration of the surface treatment, the spreading of the ink droplets on the surface of the silica substrate pattern 2 can be efficiently adjusted, whereas the spreading of the ink droplets on the surface of the gold substrate pattern 1 is not affected, by extending the duration of the ultraviolet-ozone cleaning. It shows that the ultraviolet-ozone cleaning can selectively increase the surface energy of the silica substrate pattern. In a certain range of the duration of the surface treatment, the longer the duration of the ultraviolet-ozone cleaning is, the larger is the surface energy of the silica substrate pattern. The difference between various substrate patterns can be adjusted by the method of the ultraviolet-ozone cleaning, in order to meet the requirements for printing.

Figure 9:
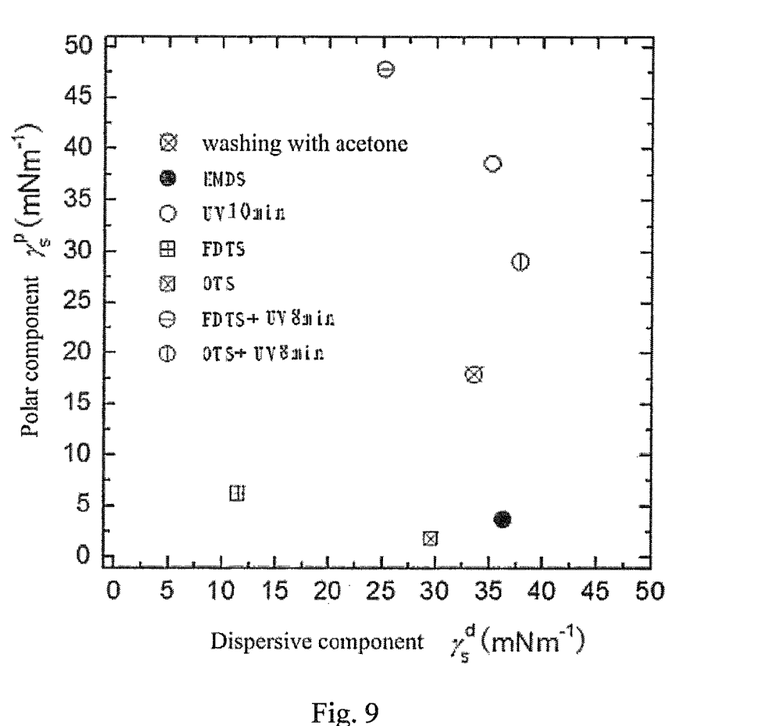
FIG. 9 shows the surface energies, which are measured by experiments, of the silica substrate patterns subjected to various surface treatments.

In the methods provided in the exemplary embodiments of invention disclosed herein, the surface energies of the substrate patterns subjected to various surface treatments can be measured by experiment. Therefore, different surface treatments can be selected to obtain quantitatively the surface energy of the substrate pattern suitable for the ink-jet printing, according to the requirements. Exemplarily, FIG. 9 shows the data of the surface energy of the silica substrate pattern subjected to various surface treatments, which were obtained by measurements in experiments. Here, the abscissa indicates the dispersive component, and the ordinate indicates the polar component. As shown in the FIG. 9, after the surface of the base plate having the silica substrate pattern formed thereon was washed by acetone (CP Acetone), the dispersive component of the silica substrate pattern is about 33 mNm$^{-1}$, while the polar component thereof is about 17 mNm$^{-1}$; after the surface of the base plate having the silica substrate pattern formed thereon was subjected to the surface treatment for forming a self-assembled monomolecular layer by using hexamethyldisilazane (HMDS), the dispersive component of the silica substrate pattern is about 36 mNm$^{-1}$, while the polar component thereof is about 4 mNm$^{-1}$; after the surface of the base plate having the silica substrate pattern formed thereon was subjected to the ultraviolet-ozone cleaning surface treatment by setting the cleaning duration at 10 min, the dispersive component of the silica substrate pattern is about 35 mNm$^{-1}$, while the polar component thereof is about 39 mNm$^{-1}$; after the surface of the base plate having the silica substrate pattern formed thereon was subjected to the surface treatment for forming a self-assembled monomolecular layer by using perfluorododecyltrichlorosilane, the dispersive component of the silica substrate pattern is about 11 mNm$^{-1}$, while the polar component thereof is about 6 mNm$^{-1}$; after the surface of the base plate having the silica substrate pattern formed thereon was subjected to the surface treatment for forming a self-assembled monomolecular layer by using octadecyltrichlorosilane, the dispersive component of the silica substrate pattern is about 30 mNm$^{-1}$, while the polar component thereof is about 2 mNm$^{-1}$; after the surface of the base plate having the silica substrate pattern formed thereon was subjected to the surface treatment for forming a self-assembled monomolecular layer by using perfluorododecyltrichlorosilane and then to the ultraviolet-ozone cleaning for 8 min, the dispersive component of the silica substrate pattern is about 25 mNm$^{-1}$, while the polar component thereof is about 48 mNm$^{-1}$; after the surface of the base plate having the silica substrate pattern formed thereon was subjected to the surface treatment for forming a self-assembled monomolecular layer by using octadecyltrichlorosilane and then to the ultraviolet-ozone cleaning for 5 min, the dispersive component of the silica substrate pattern is about 37 mNm$^{-1}$, while the polar component thereof is about 30 mNm$^{-1}$. For example, a base plate is formed to have at least two kinds of substrate patterns wherein one of the substrate patterns is a silica substrate pattern. In such a case, when a silica substrate pattern having a dispersive component of about 25 mNm$^{-1}$ and a polar component of about 48 mNm$^{-1}$ is desired in order to meet the requirements for printing, it is possible that after the surface of the base plate is firstly subjected to a surface treatment for forming a self-assembled monomolecular layer by perfluorododecyltrichlorosilane, the base plate surface is then subjected to a surface treatment by ultraviolet-ozone cleaning, wherein the duration of the ultraviolet-ozone cleaning is controlled at 8 min.

What described above are only detailed embodiments of the invention. However, the protection scope of the invention is not limited thereto. Any modifications or replacements, which can be easily envisaged by those skilled in the art, should be included in the protection scope of the invention. Therefore, the protection scope of the invention should be determined by the protection of the claims.

What is claimed is:

1. A method for surface treatment, comprising a step of subjecting a surface of a base plate having at least two kinds of substrate patterns formed thereon to a surface treatment for forming a self-assembled monomolecular layer for at least once and a surface treatment by ultraviolet-ozone cleaning, so as to make a difference between surface energies of the different substrate patterns larger or smaller.

2. The method for surface treatment according to claim 1, wherein the surface treatment for forming a self-assembled monomolecular layer specifically comprises:
   adding a material for forming a monomolecular layer or a solution containing a material for forming a monomolecular layer at a first position in a containment space, and placing the base plate having the at least two kinds of substrate patterns at a second position in the containment space, so as to make the material for forming a monomolecular layer form a monomolecular layer on surfaces of the substrate patterns.

3. The method for surface treatment according to claim 2, further comprising:
   before adding the material for forming a monomolecular layer or the solution containing the material for forming a monomolecular layer at the first position in the containment space, charging an inert gas into the containment space to discharge the air in the containment space;
   after placing the base plate having the at least two kinds of substrate patterns at the second position in the containment space, sealing the containment space and stopping charging the inert gas;
   carrying out air-exhausting for a time period so as to make the material for forming a monomolecular layer form a monomolecular layer on surfaces of the substrate patterns; and
   charging the inert gas slowly again to equilibrate the pressure in the containment space and the external pressure.

4. The method for surface treatment according to claim 3, wherein the surface treatment for forming a self-assembled monomolecular layer is conducted twice or more, wherein the materials for forming a monomolecular layer used in each time of the surface treatment for forming a self-assembled monomolecular layer conducted twice or more are different.

5. The method for surface treatment according to claim 2, wherein the material for forming a monomolecular layer is a fluorine-containing hydrophobic silane, a fluorine-containing thiophenol, or a hydrophobic silane having an alkyl chain structure.

6. The method for surface treatment according to claim 5, wherein the surface treatment for forming a self-assembled monomolecular layer is conducted twice or more, wherein the materials for forming a monomolecular layer used in each time of the surface treatment for forming a self-assembled monomolecular layer conducted twice or more are different.

7. The method for surface treatment according to claim 2, wherein the surface treatment for forming a self-assembled monomolecular layer is conducted twice or more, wherein the materials for forming a monomolecular layer used in each time of the surface treatment for forming a self-assembled monomolecular layer conducted twice or more are different.

8. The method for surface treatment according to claim 1, wherein the surface treatment for forming a self-assembled monomolecular layer specifically comprises:
   adding a solution at a concentration into a reaction vessel, wherein the solution comprises the material for forming a monomolecular layer and an organic solvent; and
   placing the base plate having the at least two kinds of substrate patterns into the solution comprising the material for forming a monomolecular layer and the organic solvent, and soaking the base plate for a time period, so as to make the material for forming a monomolecular layer form a monomolecular layer on surfaces of the substrate patterns.

9. The method for surface treatment according to claim 8, further comprising: in an oxygen-free environment, mixing at least the material for forming a monomolecular layer with the organic solvent to prepare the solution.

10. The method for surface treatment according to claim 9, wherein the material for forming a monomolecular layer is a fluorine-containing thiophenol, an alkyl thiol, or a hydrophobic silane having an alkyl chain structure.

11. The method for surface treatment according to claim 10, wherein the surface treatment for forming a self-assembled monomolecular layer is conducted twice or more, wherein the materials for forming a monomolecular layer used in each time of the surface treatment for forming a self-assembled monomolecular layer conducted twice or more are different.

12. The method for surface treatment according to claim 9, wherein the surface treatment for forming a self-assembled monomolecular layer is conducted twice or more, wherein the materials for forming a monomolecular layer used in each time of the surface treatment for forming a self-assembled monomolecular layer conducted twice or more are different.

13. The method for surface treatment according to claim 8, further comprising:
    before adding the solution at a concentration into the reaction vessel, charging an inert gas into the reaction vessel, so as to discharge the air in the reaction vessel; and
    after placing the base plate having the at least two kinds of substrate patterns into the solution comprising the material for forming a monomolecular layer, sealing the reaction vessel.

14. The method for surface treatment according to claim 13, wherein the surface treatment for forming a self-assembled monomolecular layer is conducted twice or more, wherein the materials for forming a monomolecular layer used in each time of the surface treatment for forming a self-assembled monomolecular layer conducted twice or more are different.

15. The method for surface treatment according to claim 8, wherein the surface treatment for forming a self-assembled monomolecular layer is conducted twice or more, wherein the materials for forming a monomolecular layer used in each time of the surface treatment for forming a self-assembled monomolecular layer conducted twice or more are different.

16. The method for surface treatment according to claim 1, wherein the surface treatment for forming a self-assembled monomolecular layer is conducted twice or more, wherein the materials for forming a monomolecular layer used in each time of the surface treatment for forming a self-assembled monomolecular layer conducted twice or more are different.

17. The method for surface treatment according to claim 1, wherein, in the surface treatment by ultraviolet-ozone cleaning, the time of the ultraviolet-ozone cleaning is adjusted correspondingly according to a requirement for the surface energies of the substrate patterns.

* * * * *

UNITED STATES PATENT AND TRADEMARK OFFICE
CERTIFICATE OF CORRECTION

PATENT NO. : 9,023,741 B2  
APPLICATION NO. : 14/084368  
DATED : May 5, 2015  
INVENTOR(S) : Xianghua Wang et al.

Page 1 of 1

It is certified that error appears in the above-identified patent and that said Letters Patent is hereby corrected as shown below:

IN THE SPECIFICATION

Col. 8, Line 54
  Delete "fowled"
  Insert --formed--

Signed and Sealed this
Sixth Day of October, 2015

Michelle K. Lee
*Director of the United States Patent and Trademark Office*